United States Patent [19]

Betzl et al.

[11] 4,268,806

[45] May 19, 1981

[54] ELECTRIC FILTER CIRCUIT CONSISTING OF CHARGE TRANSFER DEVICE (CTD) LINES

[76] Inventors: Hermann Betzl, Albert Rosshaupterstr. 130, 8 Muenchen 70; Friedrich Kuenemund, Strassbergerstr. 73, 8 Muenchen 40, both of Fed. Rep. of Germany

[21] Appl. No.: 871,613

[22] Filed: Jan. 23, 1978

[30] Foreign Application Priority Data

Jan. 24, 1977 [DE] Fed. Rep. of Germany ....... 2702680

[51] Int. Cl.³ .................... H03H 17/00; H03H 11/00; G11C 19/28
[52] U.S. Cl. .............................. 333/165; 307/221 D; 333/166
[58] Field of Search ............... 333/165, 166, 167, 168; 307/221 R, 221 C, 221 D; 357/24; 364/824–827, 839, 862

[56] References Cited

FOREIGN PATENT DOCUMENTS 2534319 2/1977 Fed. Rep. of Germany .
2608540 9/1977 Fed. Rep. of Germany .
2608582 9/1977 Fed. Rep. of Germany .

Primary Examiner—Marvin L. Nussbaum

[57] ABSTRACT

A filter comprising a cascade arrangement of closed line CTD filtering loops has an intermediate CTD coupling loop formed with the adjoining output coupling of the preceding filter loop and input coupling of the succeeding filter loop. Disturbing self-oscillations outside the desired passband are eliminated by adjusting the voltage amplification factors of the amplifiers within the intermediate coupling loop, for example to from about five percent to about fifteen percent less than values selected to give a pure reactance branching circuit at the middle pass frequency. The resulting slight distortion of the transmission characteristic in the pass band of the filter can then be compensated by adjusting the amplifications of other amplifiers, and if necessary the capacitance conditions can be additionally altered.

4 Claims, 11 Drawing Figures

$$k_1 = -k_2 = 1+2R, \quad R=\frac{C_3}{C_2}, \quad C_6=C_5+C_1$$

$$C_2=C_3+C_1, \quad \frac{C_5}{C_1}=\frac{R}{1+R}, \quad \eta=\frac{f}{f_0}$$

$$k_1'=-k_2'=1+2R', \quad R'=\frac{C_3'}{C_2'}, \quad C_6'=C_5'+C_1'$$

$$C_2'=C_3'+C_1', \quad \frac{C_5'}{C_1'}=\frac{R'}{1+R'}, \quad \eta=\frac{f}{f_0}$$

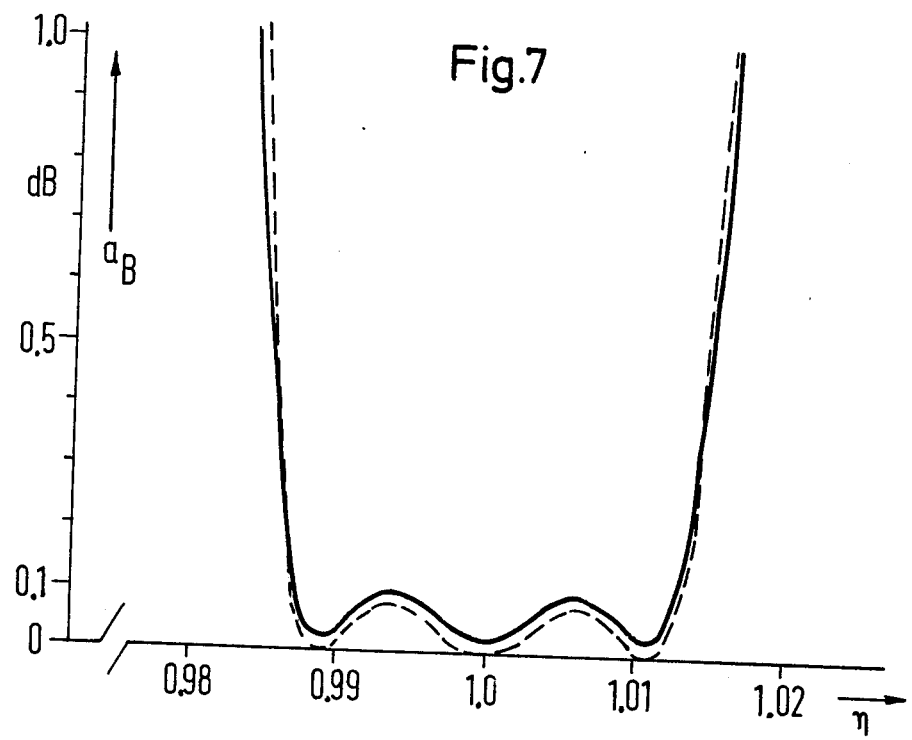
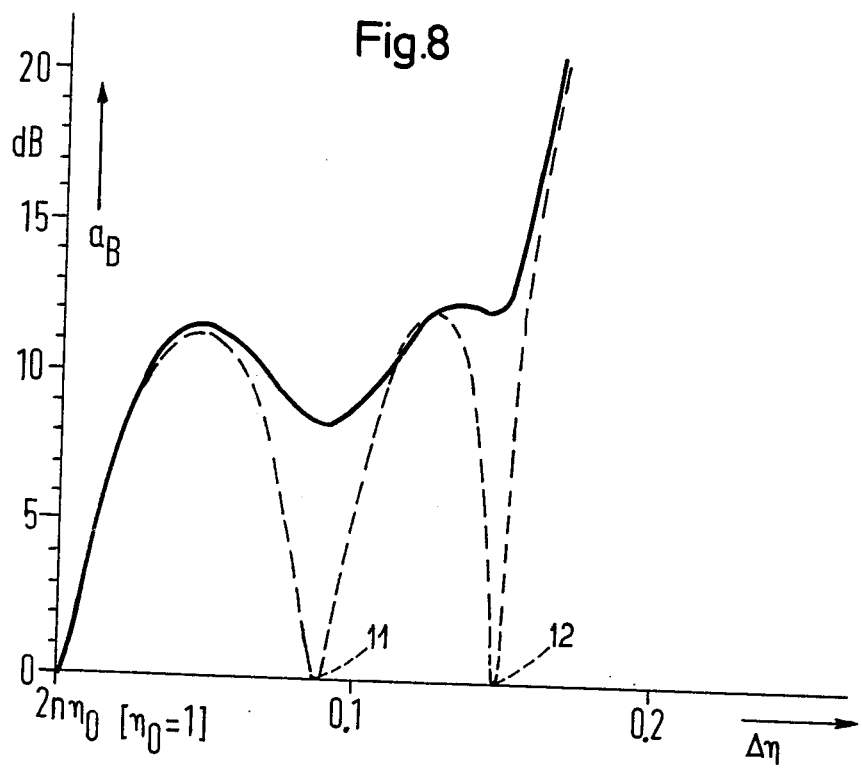

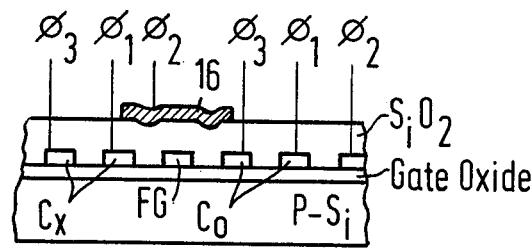
Fig.10
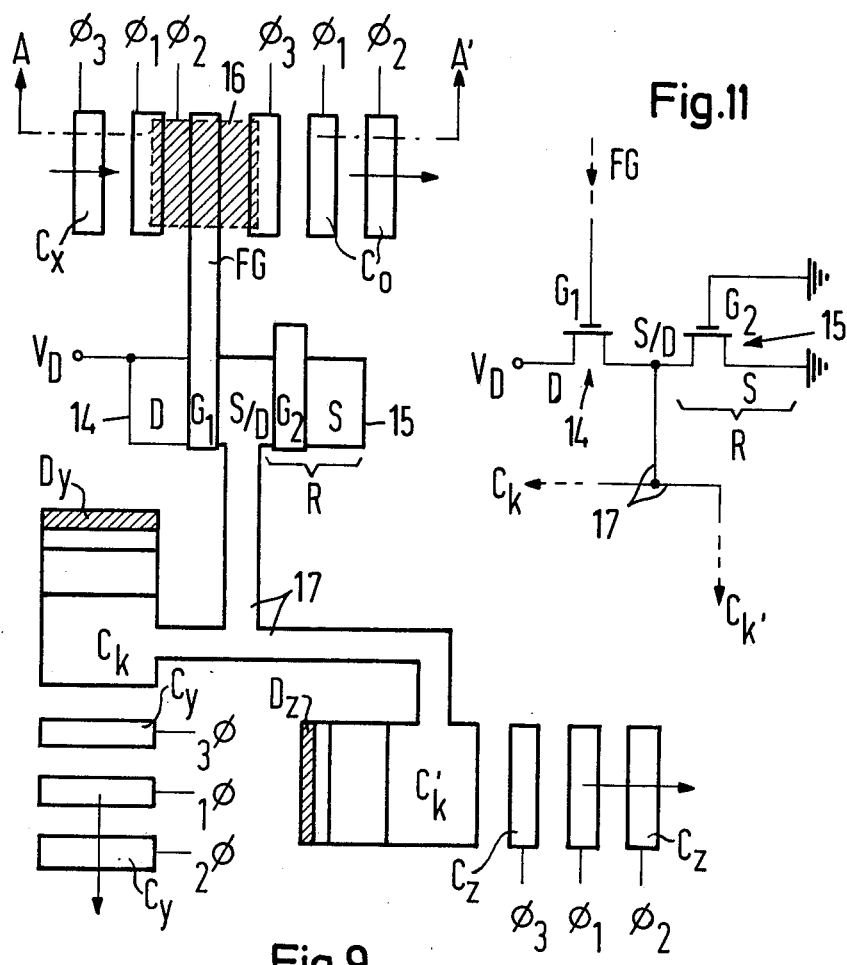
Fig.11
Fig.9

ELECTRIC FILTER CIRCUIT CONSISTING OF CHARGE TRANSFER DEVICE (CTD) LINES

BACKGROUND OF THE INVENTION

The invention relates to an electric filter circuit wherein a self enclosed line loop (or closed line loop) having the phase constant $2n\pi$ ($n=1,2\ldots$) at the required pass middle frequency, is connected at various points, in each case to at least one supply line and at least one line for the withdrawal of the electric signals, and wherein the closed line loop determines the frequency-dependent transmission characteristics of the filter circuit which is constructed in the integrated semiconductor technique as a bucket brigade device (BBD) circuit controlled by a pulse generator, or as a charge coupled device (CCD) circuit, and the image impedance of the self-enclosed line loop is selected to differ from that of the supply- and withdrawal-lines, and furthermore for the self enclosed line loop there are provided input couplings and output couplings which, together with a part of this loop and with integrated amplifiers having predetermined amplification factors, are designed in the topology of a lattice- or a $\pi$-element, in such manner that the line loop, together with the input coupling and output coupling, forms a four-arm branching circuit with the equivalent circuit diagram of a reactance branching circuit and when such branching circuits are connected in a chain circuit or cascade circuit, connection lines are provided which, together with a part of the output couplings and input couplings by which they are adjoined, form a further self-enclosed line loop which represents an intermediate coupling loop and which possesses the phase constant $(2n-1)\pi$ at the required pass middle frequency.

One of the disclosures of application U.S. Ser. No. 630,932 filed Nov. 11, 1975 and of the corresponding German Pat. No. 24 53 669 consists of electric filter circuits which can be constructed using self enclosed line loops exhibiting unidirectional transmission characteristics. The lines used can also be so-called CTD (charge transfer device) lines. Lines of this type are known per se as so-called bucket brigade device circuits, or also as so-called CCDs (charge coupled devices). The operation of these circuit components requires pulse generators as likewise described in detail in the German Pat. No. 24 53 669.

German application Ser. No. P 25 34 319.5 illustrates a possible realization of a CTD (charge transfer device) circuit of the foregoing type. This circuit can be used as input coupling and output coupling circuit for the self enclosed line loops of CTD filter circuits of this kind. Another possible realization of input coupling and output coupling circuits which is designed in the form of a $\pi$-element has been proposed in German application Ser. No. P 26 08 582.5. Still another possible realization of the input coupling and output coupling circuits is described in detail in the earlier German application Ser. No. P 26 08 540.5. A characteristic of these circuits is that, as it were, an image impedance jump is simulated, the effect of which is known per se from the microwave technique. For this reason, the individual connection lines possess different recharging capacitances.

In order to construct a multi-circuit filter circuit arrangement, it is now necessary to connect in a chain or cascade arrangement a plurality of resonance structures formed as four arm branching circuits. Circuit of this type can be represented in their electric equivalent circuit diagram as loss-free reactance branching circuits and dimensioned accordingly, as stated for example in the magazine "NTZ" 1963, edition 6, pages 297 to 302. The circuit details of a cascade connected multi-circuit filter arrangement are described in the aforementioned German patent applications. In order to connect successive line loops, it is necessary to provide a further self enclosed line loop (self closed line loop) which may be termed an intermediate coupling loop.

Investigations on which the invention has been based show that in the above described circuits, close to the resonance frequency of the self enclosed intermediate coupling loop, oscillations occur when, for example, the amplifiers thereof possess, due to production tolerances or temperature dependences, higher amplification factors than indicated by calculations. Although these oscillations do not lie within the desired pass band they act as an self-oscillation because they are oscillations which occur even when no input signal is present.

SUMMARY OF THE INVENTION

In accordance with the invention, these self-oscillations can be eliminated in that the amplification factors of the amplifiers arranged in the relevant intermediate coupling loops are selected to be smaller in quantity than stipulated by a strict dimensioning as reactance branching circuit, but not less than one.

Here amplification factors are to be understood as voltage amplification factors. In the minimum situation, the amplification factor $K_1$, $K_1'$ can assume the value 1, which is thus synonymous with being able to dispense with these amplifiers. It is particularly evident that it is advantageous to select the amplification factors to be up to approximately 15% lower than indicated in the accepted equations. Due to a deliberate reduction in the amplification factors $K_1$ and $K_1'$, a specific, slight distortion of the transmission characteristic occurs in the pass band of the filter. However, the desired transmission characteristic can be re-established in that the other amplifiers are also altered in respect of their amplification factor. If necessary the capacitance conditions R, R' can additionally be altered.

Other objects, features and advantages of the present invention will be apparent from the following detailed description taken in connection with the accompanying sheets of drawings.

BRIEF DESCRIPTION OF THE DRAWINGS

FIG. 7 is a graphical diagram illustrating the operating attenuation behavior in dependence upon the standardized frequency in the vicinity of the pass middle frequency for a cascade arrangement of three circuit units corresponding to FIG. 5;

FIG. 8 is a graphical diagram showing the attenuation course for the upper half of the undesired, parasitic pass bands of the filter whose operating attenuation is illustrated in FIG. 7;

FIG. 9 is a somewhat diagrammatic illustration of an example of the implementation for the amplifier symbols of FIGS. 2 through 6 in CCD technology with so called "floating gate" decoupling;

FIG. 10 represents a somewhat diagrammatic cross sectional view taken along the line A—A' of FIG. 9; and FIG. 11 shows the circuitry of the middle part of FIG. 9 with transistor symbols.

DETAILED DESCRIPTION

Description of FIGS. 1–4

The ninth figure of the aforementioned German Pat. No. 24 53 669 shows a circuit symbol for coupling to a self closed line loop which, for improved clarity, is shown again in FIG. 1. The unidirectional transmission characteristics of the individual conductor sections is expressed by the arrows. Thus the circuit possesses two inputs 1 and 3 and the incoming signal values are represented as wave values (i.e. charge magnitudes) $Z_1$ and $Z_3$. The circuit also possesses two outputs 2 and 4 and the outgoing signal values are shown as wave values (i.e. charge magnitudes) $W_2$ and $W_4$ again by associated arrows.

Figure 1:
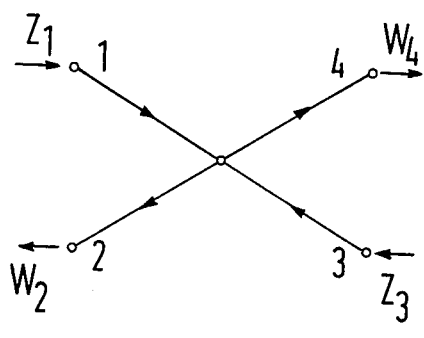
FIG. 1 shows a circuit symbol for the coupling to a self enclosed line loop (self closed line loop) and corresponds to the ninth figure of the aforementioned German Pat. No. 2,453,669.
Figure 2:
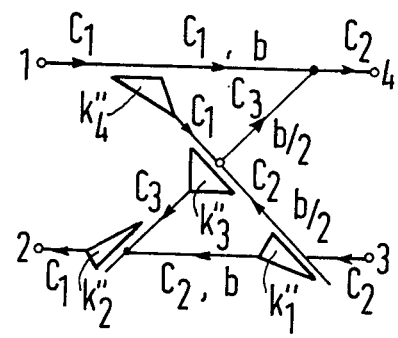
FIG. 2 illustrates a possible realization of CTD (charge transfer device) circuits as already proposed in the German patent application Ser. No. P 25 34 319.5.

FIG. 2 of the attached drawing illustrates a possible realization of CTD circuits of this type, already proposed in the German patent application Ser. No. P 25 34 319.5 (published Feb. 3, 1977). This circuit can be used as input coupling- and output coupling-circuit for the self closed line loops of CTD filter circuits of this kind. The transmission directions of the individual lines are likewise characterized by arrows. The circuit itself is constructed in the topology of a lattice network circuit. The circuit contains the amplifiers $K_1''$, $K_2''$, $K_3''$ and $K_4''$.

The circuit symbols of the amplifiers are to indicate that in accordance with the voltage state of the line by which they are adjoined, they produce charges in the line to which they are directly connected. The recharging capacitances (i.e. magnitudes of transfer capacitances) of the individual CTD lines are likewise entered in FIG. 2 where they are referenced $C_1$, $C_2$ and $C_3$. The phase constant of the individual line sections is also shown, and it can be seen that the horizontal lines possess the phase constant b, and the sections of the diagonal lines possess the phase constant b/2. Thus, as a result of the circuit topology, a signal path is formed from the input 1 to the outputs 2 and 4, and a signal path is also formed from the input 3 to the outputs 2 and 4.

Figure 3:
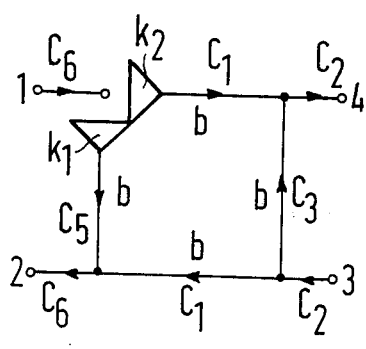
FIG. 3 shows another possible realization of input coupling and output coupling circuits as already proposed in German patent application Ser. No. P 26 08 582.5.

FIG. 3 shows another possible realization of input coupling and output coupling circuits which is designed in the form of a $\pi$-element. Circuits of this kind have already been proposed in German patent application P Ser. No. 26 08 582.5 (published Sept. 8, 1977). The amplifiers employed are so-called double amplifiers which are referenced $K_1$ and $K_2$ in FIG. 3 and which possess a common input across the recharging capacitance referenced $C_6$, and whose outputs lead to the recharging capacitances, referenced $C_1$ and $C_5$, of the adjoining CTD lines. The inputs and outputs of the $\pi$-circuit are again provided with the reference numerals 1 to 4 and the transmission directions of the unidirectional line sections can be seen from the arrows. With the represented circuit it should merely be ensured that the phase constant of the lines employed in the $\pi$-branches has the value b.

Figure 4:
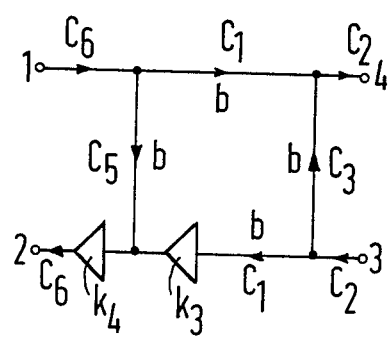
FIG. 4 illustrates another possible realization of the input coupling and the output coupling circuits, the mode of operation of which is described in detail in German patent application Ser. No. P 26 08 540.5.

FIG. 4 illustrates another possible realization of the input coupling and output coupling circuits which are employed, the mode of operation of which is described in detail in German patent application Ser. No. P 26 08 540.5 (published Sept. 8, 1977). In contrast to FIG. 3, in the circuit shown in FIG. 4 two separate amplifiers $K_3$ and $K_4$ have been used which are in each case connected into a line possessing the same recharging capacitance (thus e.g. $C_1$ and $C_6$ at the input and output).

As already explained in the aforementioned German patent publications, a characteristic of the circuits shown in FIGS. 2 to 4 is that, as it were, an image impedance jump is simulated, the effect of which is known per se from the microwave technique. For this reason the individual connection lines 1, 2 and 3, 4 possess different recharging capacitances to e.g. $C_6$ and $C_2$.

Figure 5:
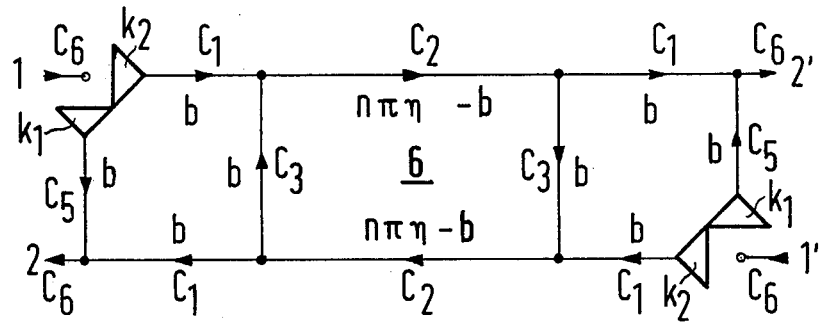
FIG. 5 shows an arrangement of a self closed line loop, together with the input coupling and output coupling, to form a four-arm branching circuit using by way of example the circuit of FIG. 3 as input coupling and output coupling.
Figure 6:
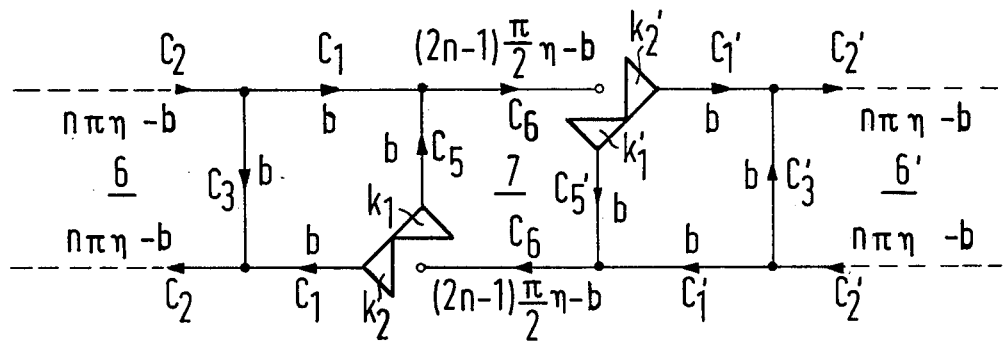
FIG. 6 shows a cascade multi-circuit filter arrangement including a plurality of resonance structures corresponding to that of FIG. 5.

Description of FIGS. 5 and 6

FIG. 5 shows the method of procedure to enable a self enclosed line loop (self closed line loop 6), together with the input coupling and output coupling, to form, as it were, a four-arm branching circuit. The circuit already shown in FIG. 3 has been used directly as input coupling and output coupling. The self closed line loop 6 is formed by the two lines having the recharging capacitance $C_2$ and by the two line sections having the recharging capacitance $C_3$. The lines referenced $C_2$ possess the phase constant $n\pi\eta$-b and the lines referenced $C_3$ possess the phase constant b. As can be directly seen from FIG. 5, the line sections having the recharging capacitances $C_3$ simultaneously form part of the self closed line ring 6 and of the input coupling and output coupling circuits. For the related frequency $\eta=f/f_o=1$, the self closed line loop 6 is in resonance; here f is the running frequency variable and $f_o$ the middle frequency of the desired pass band. The mode of operation of the branching circuit amounts to the fact that at the resonance frequency $f_o$, the entire energy fed in at the input 1 appears at the output 2'. With an increasing deviation from the resonance frequency, increasingly more energy appears at the output 2. Correspondingly it is true that at the resonance frequency $f_o$ the entire energy fed into the input 1' appears at the output 2 and with an increasing deviation from the resonance frequency increasingly more energy appears at the output 2'. This branching function is rigorously fulfilled when the relations, simultaneously shown in FIG. 5, between the recharging capacitances and the amplification factors are adhered to. Circuits of this type can be represented in their electric equivalent circuit diagram as loss-free reactance branching circuits and dimensioned accordingly, as stated for example in the magazine NTZ 1963, edition 6, pages 297 to 302.

In order to construct a multi-circuit filter arrangement it is now necessary to connect in a chain or cascade relationship a plurality of resonance structures corresponding to FIG. 5. This type of possibility is shown in FIG. 6, the circuit details of which are likewise described in the afroementioned German patent publications. Similarly to FIG. 5, the resonant circuit sections are referenced 6 and 6'. The input coupling and output coupling circuits corresponding to FIG. 3 can also be seen. In order to interconnect the line loops 6 and 6' it is necessary to provide a further self enclosed line loop (self closed line loop) which is indicated in FIG. 6 by the reference numeral 7. Here this line loop is referred to as intermediate coupling loop and is formed together with the components ($C_5$, $C_5'$) of the adjoining input couplings and output couplings. The lines which serve to form the chain circuit possess the recharging capacitances $C_6$. Their phase constant amounts to $(2n-1)\pi/2\eta - b$. In order to indicate that the lines and amplifiers employed in various resonant sections (such as e.g. in 6 and 6') can be differently designed, in the circuit shown in FIG. 6 those recharging capacitances and amplification factors of the right-hand side of the circuit which correspond to the left-hand half of the circuit have been provided with an apostrophe. The additionally entered equations for the apostrophied values also directly indicate the similarity to FIG. 5.

Investigations on which the invention has been based show that in the above described circuits, close to the resonance frequency of the self-enclosed intermediate coupling loop 7, FIG. 6, oscillations occur when, for example, the amplifiers $K_1$ and $K_1'$ possess, due to production tolerances or temperature dependencies, higher amplification factors than indicated by calculations. Although these oscillations do not lie within the desired pass band they act as a self-oscillation because they are oscillations which occur even when no input signal is present.

In accordance with the invention, these self-oscillations can be eliminated in that the amplification factors of the amplifiers ($K_1$, $K_1'$) arranged in the relevant intermediate coupling loops are selected to be smaller in quantity than stipulated by a strict dimensioning as reactance branching circuit, but no less than one.

Here amplification factors are to be understood as voltage amplification factors. In the mimimum situation, the amplification factor $K_1$, $K_1'$ can assume the value 1, which is thus synonymous with being able to dispense with these amplifiers. It is particularly evident that it is advantageous to select the amplification factors to be up to approximately 15% lower than indicated in the equations corresponding to FIG. 5 and FIG. 6. Due to a deliberate reduction in the amplification factors $K_1$ and $K_1'$, a specific, slight distortion of the transmission characteristic occurs in the pass band of the filter. However, the desired transmission characteristic can be reestablished in that the other amplifiers in the example shown in FIG. 6-thus the amplifiers $K_2$ and $K_2'$—are also altered in respect of their amplification factor. If necessary the capacitance conditions R, R' can additionally be altered.

Description of FIGS. 7 and 8

FIGS. 7 and 8 illustrate in detail the effects of the aforementioned measures with respect to a circuit of the type shown in FIGS. 5 and 6.

FIG. 7 illustrate the operating attenuation behavior $a_B$ in dependence upon the standarized frequency $\eta = f/f_o$ in the vicinity of the pass middle frequency $\eta = 1$. A three-circuit filter has been selected by way of example, i.e. thus a chain circuit or cascade connection of three circuit units corresponding to FIG. 5. FIG. 8 shows the attenuation course for the upper half of the undesired, parasitic pass bands of the filter with even-numbered multiples ($2n\eta_o$, where $\eta_o = 1$) of the desired pass middle frequency, where $\Delta\eta$ represents the deviation from $2n\eta_o$.

In FIGS. 7 and 8, the broken-line (or dash line) curves indicate the theoretical course, i.e. thus simultaneously the course achieved when the equations given in FIGS. 5 and 6 are exactly adhered to. The aforementioned oscillations here lie in the vicinity of the minima at $\Delta\eta \neq 0$ in FIG. 8. The solid-line curves indicate the attenuation course when the above described reduction in the amplification factors $K_1$, $K_1'$, and at the same time the correction of the amplification factors $K_2$ and $K_2'$ and of the capacitance conditions R and R' is effected. The attenuation minima (indicated at 11 and 12, FIG. 8, for the dash line curve) are clearly raised, in the example shown by the solid line curve in FIG. 8 approximately 10 dB and more, whereas the pass attenuation shown by the solid line curve at the central part in FIG. 7 only slightly increases (0.02 dB), which is of no significance for practical use. In the selected example, the amplification factors $K_1$ and $K_1'$ were reduced by 5% relative to the formula value in FIGS. 5 and 6, whereas the values for $K_2$, $K_2'$, R and R' remain unchanged. The increase in attenuation which can be seen from FIG. 8 fully eliminates the danger of oscillations, i.e. even with production tolerances and temperature-dependent changes in the order of 5%, no oscillations occur.

Description of FIGS. 9-11

In order to clarify the amplifier symbols in FIGS. 2 through 6, FIG. 9 illustrates an example of the realization of amplifiers such as shown in FIGS. 2, 3, 5 and 6 in CCD technology with a so-called "floating gate" decoupling (or output coupling) such as is also described, among others, by D. D. Wen under the title "Design and Operation of a Floating Gate Amplifier" in IEEE Journal of Solid State Circuits, Vol. SC 9, No. 6, December 1974, pages 410–414. FIG. 10 represents the cross-section A-A' (FIG. 9) along the CCD line containing a floating gate electrode (FG) in FIG. 9. The FG-electrode is supplied with none of the clock-pulse (or timing) voltages $\phi_1$ through $\phi_3$; on the contrary, it is connected to the gate $G_1$, FIG. 9, of a field effect transistor 14 which operates as a source-follower, whereby the source resistance R is realized with gate $G_2$ by means of a further field effect transistor 15. FIG. 11 illustrates this section from the plan view of the substrate of FIG. 9 with transistor symbols for field effect transistors 14 and 15.

In order not to interfere with the charge transport along the CCD line with the transfer charge capacitances $C_x$ and $C_o$, the CCD electrode 16, for the pulse (or timing) voltage $\phi_2$, is arranged above the floating gate electrode FG. The voltage established at the floating gate electrode FG controls the current flow through both field effect transistors 14 and 15 and hence the voltage at the source/drain electrode S/D, with which the transfer charge capacitances $C_K$ and $C_K'$, FIG. 9, are charged via conductive path 17. Thus, with $C_K$ or $C_K' >$ than $C_x$, FIG. 9, a charge amplification is provided; with $C_K > C_Y$ and $C_K' > C_Z$, the charge amplification is converted into a voltage amplification. $C_Y$ and $C_Z$ are the transfer charge capacitances of two additional CCD-lines. The charging of capacitances $C_K$ or $C_K'$ with the aid of diodes $D_Y$ or $D_Z$, respectively, FIG. 9, and hence the feeding of a signal into a CCD line is described by C. M. Sequin and A. M. Mohsen under the title "Linearity of electrical charge injection into charge-coupled devices" in IEEE Journal of Solid-State Circuit, Vol. SC 10, No. 2, April 1975, pages 81–92.

If the transfer charge capacitances $C_x = C_o = C_Y = C_1$ are placed in FIG. 9, and $C_Z = C_K' = 0$, this results, for example, in a realization of the amplifier $K_4''$ in FIG. 2. A double amplifier $K_1$, $K_2$, for example in FIG. 3, FIG. 5 or FIG. 6, results with $C_x = C_6$; $C_Y = C_5$ and $C_z = C_1$. In addition, the charge reaching the transfer charge capacitance $C_o$ must be diverted (destroyed) after each transfer charge operation, in order that the following charge packet can be ready to be received.

This also applies to the realization of e.g. amplifier $K_3$ in FIG. 4, for which $C_x = C_Y = C_1$ and $C_Z = C_K' = 0$ are to be established.

As illustrated in FIGS. 5 and 6 by the different capacitance designations $C_1$, $C_2$, $C_6$, $C_1'$, and $C_2'$, the capacitance values of the closed line loops 6, 6', 7 are different from the capacitor values of the associated input and output lines.

As indicated in FIGS. 9 and 10, each closed line loop is implemented completely on a semiconductor substrate using integrated semiconductor charge transfer device techniques. Thus the CCD clocked capacitors such as $C_o$, $C_x$, $C_y$, $C_z$ in FIGS. 9 and 10, indicate one implementation of the capacitors of FIGS. 5 and 6. For implementing amplifiers such as $K_1$, $K_2$ and $K_1'$, $K_2'$, the relationships previously described for FIGS. 9 and 10 apply, i.e. $C_k > C_x$, $C_K' > C_x$, $C_k > C_y$, $C_k' > C_z$.

The frequency of operation for the embodiments of FIGS. 5–11 described herein is below the microwave range, and the entire cascade filter structure of FIGS. 6–10 is preferably completely implemented on a common silicon substrate without any hybrid components. The resonance frequency of each closed line loop is determined by the pulse frequency of the CCD or BBD line.

The disclosure of the aforementioned U.S. application for patent U.S. Ser. No. 630,932 filed Nov. 11, 1975 and each of the aforementioned German published applications is incorporated herein by reference for the sake of further background.

It will be apparent that many modifications and variations may be effected without departing from the scope of the novel concepts and teachings of the present invention.

We claim as our invention:

1. An electric filter comprising a cascade arrangement (FIG. 6) including successive four-arm branching circuits (FIG. 5), the branching circuits comprising respective self closed line loops (6, 6') for determining the frequency-dependent transmission characteristics of the filter, said self closed line loops (6, 6') each having an input coupling (FIG. 3) for supplying an input signal to the self closed line loop, and an output coupling (FIG. 3) for the withdrawal of an output signal from the self closed line loop, the signal within the self closed line loop having a phase constant of generally 2n $\pi$ (where n is a positive integer) in relation to the phase of the input and output signals at a pass middle frequency ($f_o$), the cascade arrangement further including intermediate coupling loop means (7) between the successive four-arm branching circuits (6, 6'), each intermediate coupling loop means (7) forming a further self closed line loop with an adjoining part of the output coupling of the preceding four-arm branching circuit (6) and an adjoining part of the input coupling of the succeeding four-arm branching circuit (6'), said further self closed line loop including amplifiers ($K_1$, $K_1'$) with voltage amplification factors which are smaller than the voltage amplification values required for operating each of said branching circuits (6, 6') as a substantially Loss-free reactance branching circuit at the pass middle frequency ($f_o$), but which voltage amplification factors are not less than one.

2. A filter circuit as claimed in claim 1, characterized in that the amplification factors ($K_1$, $K_1'$) are selected to be from about five percent to about fifteen percent lower than the amplification values required for a pure reactance branching circuit at the pass middle frequency ($f_o$).

3. A filter circuit as claimed in claim 1 with the output and input couplings (FIG. 3) connected with the intermediate coupling loop means (7) comprising other amplifiers ($K_2$, $K_2'$, FIG. 6) with amplification factors altered so as to at least partly compensate for the effect of the smaller amplification factors of the amplifiers ($K_1$, $K_1'$) on the pass characteristic (FIG. 7) of the filter.

4. A filter circuit as claimed in claim 1 with the four-arm branching circuits (FIG. 5) including other amplifiers with respective amplification factors, $K_2$, $K_2'$, which are larger in magnitude than the amplification factors, $K_1$, $K_1'$, of said amplifiers of said further self closed line loop (7), and the self closed line loops (6, 6') of said four-arm branching circuits (FIG. 5) including clocked capacitors with capacitance values, $C_2$, $C_3$, $C_2'$, $C_3'$, such that the ratio of $C_3/C_2$ differs from the magnitude of one-half of the sum of minus $K_2$ and minus one, and the ratio of $C_3'/C_2'$ differs from the magnitude of one-half of the sum of minus $K_2'$ and minus one, sufficiently to at least partly compensate for the effect of the smaller amplification factors $K_1$, $K_1'$, on the pass characteristic (FIG. 7) of the filter.

* * * * *